US011453620B2

(12) United States Patent
Chida

(10) Patent No.: US 11,453,620 B2
(45) Date of Patent: Sep. 27, 2022

(54) SIC COAT

(71) Applicant: ADMAP INC., Tamano (JP)

(72) Inventor: Shimpei Chida, Tamano (JP)

(73) Assignee: ADMAP INC., Tamano (JP)

( * ) Notice: Subject to any disclaimer, the term of this patent is extended or adjusted under 35 U.S.C. 154(b) by 607 days.

(21) Appl. No.: 16/494,195

(22) PCT Filed: Mar. 28, 2019

(86) PCT No.: PCT/JP2019/013823
§ 371 (c)(1),
(2) Date: Sep. 13, 2019

(87) PCT Pub. No.: WO2020/003669
PCT Pub. Date: Jan. 2, 2020

(65) Prior Publication Data
US 2021/0351013 A1    Nov. 11, 2021

(30) Foreign Application Priority Data

Jun. 27, 2018    (JP) .............................. JP2018-121519

(51) Int. Cl.
*B32B 9/00* (2006.01)
*C04B 41/50* (2006.01)
*H01L 21/02* (2006.01)
*H01J 37/32* (2006.01)

(52) U.S. Cl.
CPC .... *C04B 41/5059* (2013.01); *H01L 21/02529* (2013.01); *H01J 37/32495* (2013.01)

(58) Field of Classification Search
None
See application file for complete search history.

(56) References Cited

U.S. PATENT DOCUMENTS 6,617,059 B1 * 9/2003 Furukubo ............... B32B 15/01
428/192
7,318,847 B2 * 1/2008 Massler ............... F16C 33/1075
427/249.7
2008/0203420 A1    8/2008 Higaki et al.

FOREIGN PATENT DOCUMENTS

JP    2000327459 A * 11/2000    ........... C04B 35/565
JP    2014-192163 A    10/2014
JP    2016-011242 A    1/2016
(Continued)

OTHER PUBLICATIONS

Feb. 26, 2020 Notice of Allowance issued in Taiwanese Patent Application No. 108121948.

*Primary Examiner* — Seth Dumbris
(74) *Attorney, Agent, or Firm* — Oliff PLC

(57) ABSTRACT

A SiC coat having an outer surface including a back face, a front face opposite to the back face, a first side face extending in a direction from the back face toward the front face, and a first R-surface between the back face and the first side face, the SiC coat including: an overcoat configured to include a first upper layer side-face portion that forms the first side face and the first R-surface of the outer surface; and an undercoat configured to include a backface portion that forms the back face of the outer surface and a first lower layer side-face portion covered by the first upper layer side-face portion of the overcoat, wherein the first upper layer side-face portion and the backface portion form a first interface, and the first interface appears on the first R-surface of the outer surface.

10 Claims, 6 Drawing Sheets

(56) References Cited

FOREIGN PATENT DOCUMENTS

| JP | 2017-050446 A | 3/2017 |
|---|---|---|
| TW | 200824058 A | 6/2008 |

* cited by examiner

SIC COAT

FIELD OF THE INVENTION

The present invention relates to a SiC coat formed of SiC that covers a coating target.

BACKGROUND OF THE INVENTION

A SiC coat formed of silicon carbide (SiC) has excellent properties such as high durability, high acid resistance, and low specific resistance, and is widely used as a component for a semiconductor manufacturing apparatus. For example, Patent Document 1 discusses a component for a semiconductor manufacturing apparatus, including a graphite substrate and a SiC coat that covers the graphite substrate. This SiC coat has a two-layer structure including an undercoat and an overcoat.

CITATION LIST

Patent Documents

Patent Document 1: Japanese Unexamined Patent Application Publication No. 2016-011242

SUMMARY OF THE INVENTION

In the semiconductor manufacturing apparatus, a product defect may occur in a wafer due to even a slight processing variation. In addition, since the semiconductor manufacturing apparatus is used to treat a large number of wafers in a factory, a problem of the product defect of the wafer may spread to a large number of wafers without limiting to only a single wafer. Therefore, a user of the semiconductor manufacturing apparatus strictly controls the quality of the semiconductor manufacturing apparatus and components used therein.

In some cases, the SiC coat may be required to have different film thicknesses on each side of the component. For example, it is demanded that the front face be made thinner to increase conductivity, and the back face be made thicker to increase plasma resistance. If the SiC coat having the two-layer structure described above is grinded in order to satisfy such a demand, an interface between an undercoat and an overcoat may appear on the outer surface of the SiC in some cases. Such an interface may sometimes concern a user of the semiconductor manufacturing apparatus.

In view of such problems, the present invention provides a technology for preventing poor appearance of the SiC coat.

In order to address the aforementioned problems, according to the first aspect, there is provided an SiC coat having an outer surface including a back face, a front face opposite to the back face, a first side face extending in a direction from the back face toward the front face, and a first R-surface between the back face and the first side face, the SiC coat including: an overcoat configured to include a first upper layer side-face portion that forms the first side face and the first R-surface of the outer surface; and an undercoat configured to include a backface portion that forms the back face of the outer surface and a first lower layer side-face portion covered by the first upper layer side-face portion of the overcoat, wherein the first upper layer side-face portion and the backface portion form a first interface, and the first interface appears on the first R-surface of the outer surface.

In general, a curved surface forms bright and dark portions by virtue of reflection of light when the light is received. The bright and dark portions make a line or pattern on the curved surface inconspicuous. According to the first aspect, since the first interface appears on the first R-surface, it becomes inconspicuous.

Note that the R-surface refers to a curved surface formed through R-filleting or the like. However, the R-filleting is not indispensable. For example, such a shape of the curved surface naturally formed through crystal growth of SiC may be also regarded as the R-surface.

According to the second aspect, it is conceivable that the first R-surface extends along a first direction perpendicular to a normal direction of the back face and a normal direction of the first side face, and the first interface appearing on the first R-surface extends along the first direction.

In this aspect, the first interface appearing on the first R-surface extends along the same direction as those of the bright and dark portions. As a result, the first interface becomes inconspicuous.

According to the third aspect, it is conceivable that the outer surface further includes a second side face opposite to the first side face and a second R-surface between the back face and the second side face, the overcoat further includes a second upper layer side-face portion that forms the second side face and the second R-surface of the outer surface, the undercoat further includes a second lower layer side-face portion covered by the second upper layer side-face portion of the overcoat, the second upper layer side-face portion and the backface portion form a second interface, and the second interface appears on the second R-surface of the outer surface.

In this aspect, on the basis of the same principle as that of the first aspect, the second interface appearing on the second R-surface becomes inconspicuous.

According to the fourth aspect, it is conceivable that the second R-surface extends along a second direction perpendicular to a normal direction of the back face and a normal direction of the second side face, and the second interface appearing on the second R-surface extends along the second direction.

In this aspect, on the basis of the same principle as that of the second aspect, the second interface appearing on the second R-surface becomes more inconspicuous.

According to the fifth aspect, it is conceivable that the outer surface further includes a second side face opposite to the first side face and a third R-surface between the front face and the second side face, the overcoat further includes an upper layer front-face portion that forms the front face and the third R-surface of the outer surface, the undercoat further includes a second lower layer side-face portion that forms the second side face and a lower layer front-face portion covered by the upper layer front-face portion of the overcoat, the upper layer front-face portion and the second lower layer side-face portion form a third interface, and the third interface appears on the third R-surface of the outer surface.

In this aspect, on the basis of the same principle as that of the first aspect, the third interface appearing on the third R-surface becomes inconspicuous.

According to the sixth aspect, it is conceivable that the third R-surface extends along a second direction perpendicular to a normal direction of the back face and a normal direction of the second side face, and the third interface appearing on the third R-surface extends along the second direction.

In this aspect, on the basis of the same principle as that of the second aspect, the third interface appearing on the third R-surface becomes more inconspicuous.

According to the seventh aspect, it is conceivable that both the first upper layer side-face portion and the first lower layer side-face portion have a surface having an arc shape on a cross section perpendicular to the back face and the first side face, and a center of the arc of the first upper layer side-face portion is placed in a position different from a center of the arc of the first lower layer side-face portion.

In this aspect, the first interface can appear on the first R-surface. Note that it is assumed that the terminology "arc" includes not only arcs of mathematically strict meaning, but also arcs having an area distorted with an unevenness that does not affect a curved surface shape as an arc. In the case of an arc having such an area, a representative arc portion on the arc may be extracted, and the center of the extracted arc portion may be determined.

According to the eighth aspect, it is conceivable that the arc of the first upper layer side-face portion has a radius of curvature equal to or larger than a radius of curvature of the arc of the first lower layer side-face portion.

Conversely, the radius of curvature of the arc of the first upper layer side-face portion may be smaller than the radius of curvature of the arc of the first lower layer side-face portion. However, in the case of the eighth aspect, the first R-surface can be formed as a smooth domical surface. Note that, when the arc is distorted, it may be difficult to measure the radius of curvature of the arc. In this case, a representative arc portion on the arc may be extracted, and a radius of curvature of the extracted arc portion may be determined. The terminology "~ or larger (greater or higher)" means "~ equal to or larger (greater or higher)".

According to the ninth aspect, it is conceivable that the backface portion of the undercoat has a film thickness smaller than a film thickness of the first lower layer side-face portion of the undercoat.

In this aspect, it is possible to make the film thickness of the backface portion of the SiC coat thinner than the film thickness of the first side face portion. As a result, for example, it is possible to increase the conductivity of the backface portion of the SiC coat relative to that of the first side face portion.

According to the tenth aspect, it is conceivable that the SiC coat covers an annular substrate having a back face, a front face, an inner circumferential surface between the back face and the front face, and an outer circumferential surface between the back face and the front face, the backface portion of the undercoat covers the back face of the annular substrate, and the first lower layer side-face portion of the undercoat covers the inner circumferential surface or the outer circumferential surface of the annular substrate.

DESCRIPTION OF EMBODIMENTS

Embodiments of the present invention will now be described with reference to the accompanying drawings.

(1) General Configuration

Figure 1:
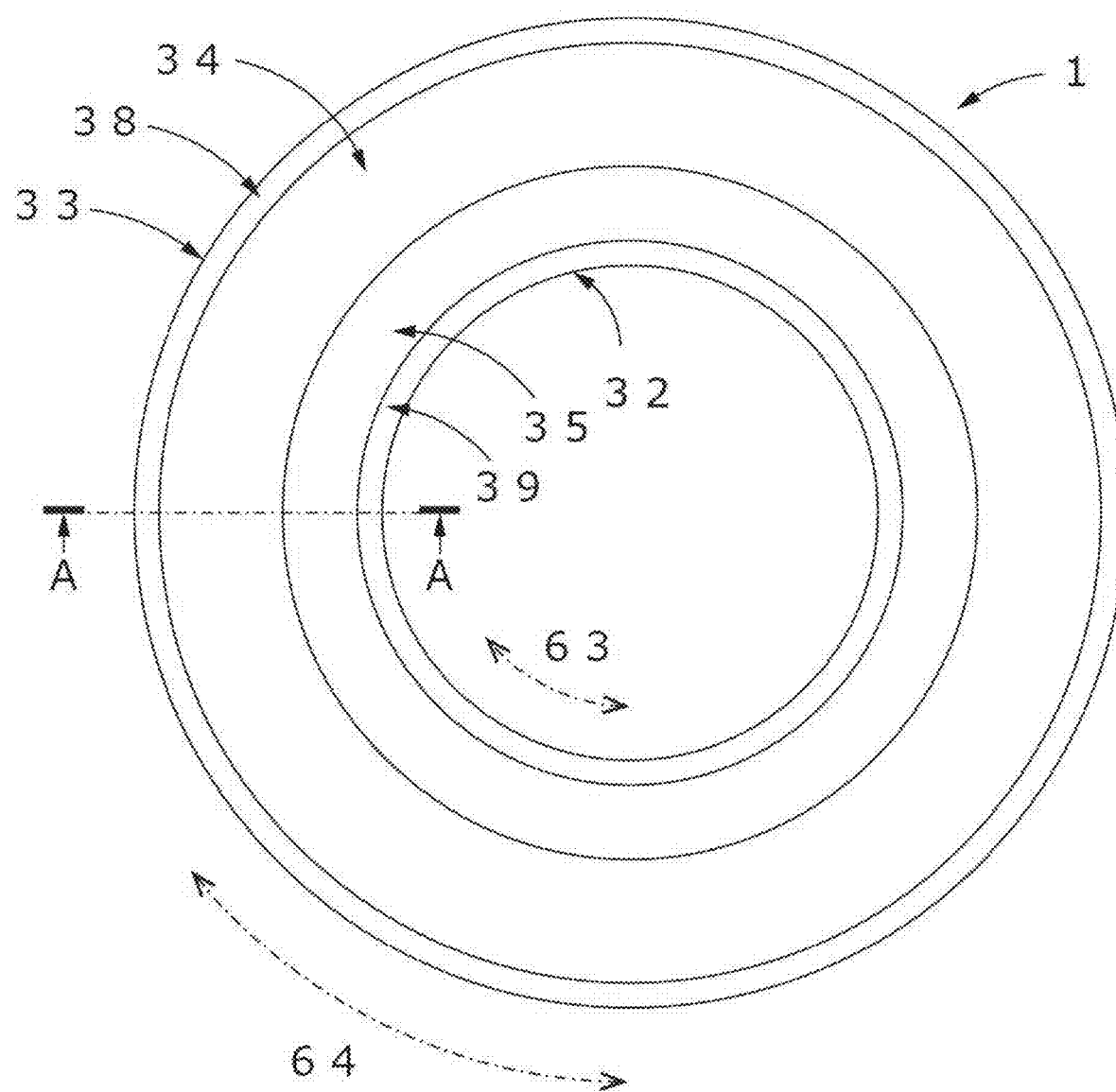
FIG. 1 is a plan view illustrating a front face of an outer ring.
Figure 2:
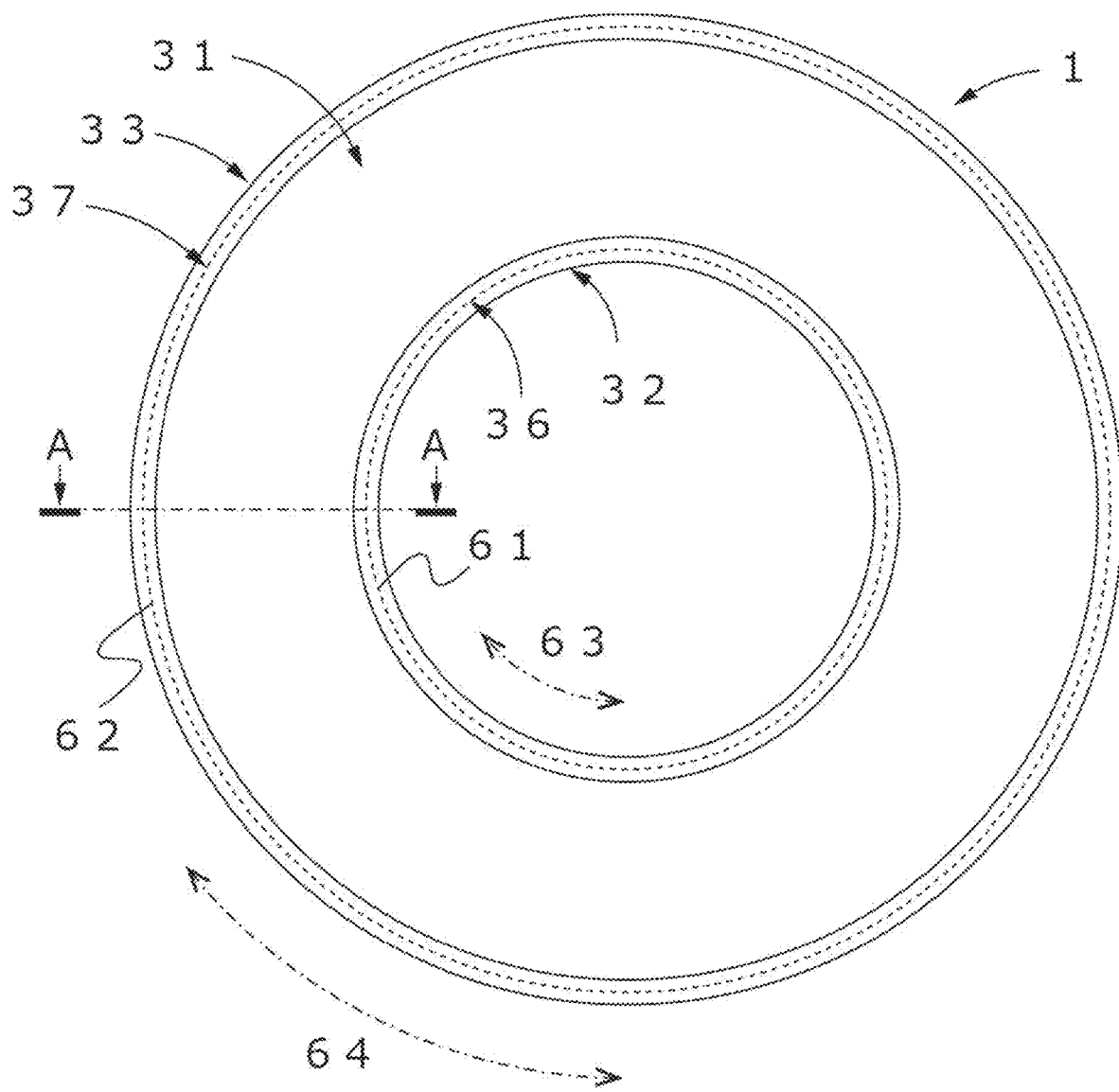
FIG. 2 is a plan view illustrating a back face of the outer ring.

As illustrated in FIGS. 1 and 2, the outer ring 1 is an annular component. The outer ring 1 is placed inside a chamber of a plasma etching apparatus and surrounds a plasma generation region of the chamber in order to prevent plasma dispersion.

Figure 3:
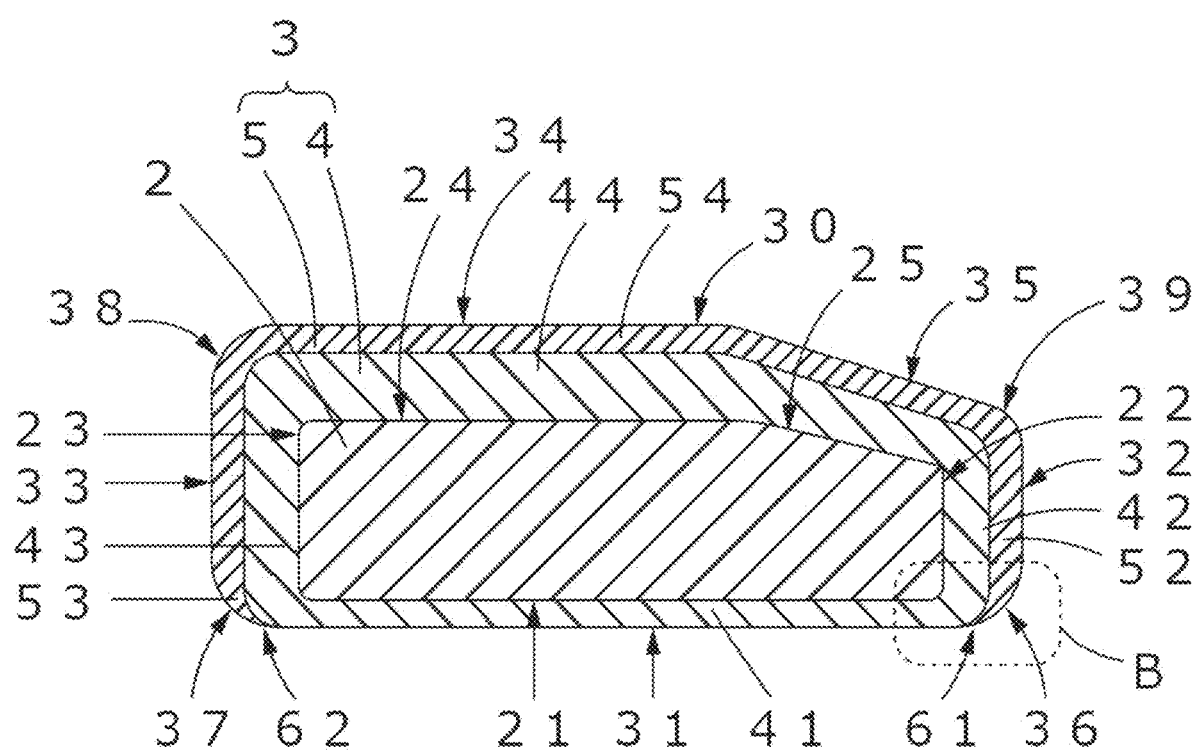
FIG. 3 is a cross-sectional view taken along the line A-A of the plan view of the outer ring.

As illustrated in FIG. 3, the outer ring 1 has an annular substrate 2 and an SiC coat 3 that entirely covers the annular substrate 2. The annular substrate 2 has a back face 21, a front face 24, an inner circumferential surface 22 between the back face 21 and the front face 24, and an outer circumferential surface 23 between the back face 21 and the front face 24. The front face 24 has a tapered surface 25 in a place close to the inner circumferential surface 22. The annular substrate 2 is formed of, for example, SiC or graphite. The SiC coat 3 is formed of, for example, CVD-SiC which is SiC formed through chemical vapor deposition (CVD).

As illustrated in FIG. 3, the SiC coat 3 has an outer surface 30. The outer surface 30 includes a back face 31, a first side face 32, a second side face 33, and a front face 34. The front face 34 is opposite to the back face 31. The first side face 32 extends in a direction from the back face 31 toward the front face 34. According to this embodiment, the first side face 32 corresponds to the inner circumferential surface of the outer ring 1. The second side face 33 is opposite to the first side face 32. According to this embodiment, the second side face 33 corresponds to the outer circumferential surface of the outer ring 1. The outer surface 30 further includes a first R-surface 36, a second R-surface 37, a third R-surface 38, and a fourth R-surface 39. The first R-surface 36 is positioned between the back face 31 and the first side face 32. The second R-surface 37 is positioned between the back face 31 and the second side face 33. The third R-surface 38 is positioned between the second side face 33 and the front face 34. The fourth R-surface 39 is positioned between the front face 34 and the first side face 32. The front face 34 has a tapered surface 35 in the vicinity of the first side face 32.

The shape of the outer surface 30 of the SiC coat 3 is rounded through grinding or R-filleting.

The SiC coat 3 includes an undercoat 4 that entirely covers the annular substrate 2. The undercoat 4 includes a backface portion 41, a first lower layer side-face portion 42, a second lower layer side-face portion 43, and a lower layer front-face portion 44. The backface portion 41 covers the back face 21 of the annular substrate 2. The first lower layer side-face portion 42 covers the inner circumferential surface 22 of the annular substrate 2. The second lower layer side-face portion 43 covers the outer circumferential surface 23 of the annular substrate 2. The lower layer front-face portion 44 covers the front face 24 of the annular substrate 2.

The SiC coat 3 includes an overcoat 5 that partially covers the undercoat 4. The overcoat 5 includes a first upper layer side-face portion 52, a second upper layer side-face portion 53, and an upper layer front-face portion 54. The first upper layer side-face portion 52 covers a first lower layer side-face portion 42 of the undercoat 4. The second upper layer side-face portion 53 covers the second lower layer side-face portion 43 of the undercoat 4. The upper layer front-face portion 54 covers the lower layer front-face portion 44 of the undercoat 4.

As illustrated in FIG. 3, the undercoat 4 forms the back face 31 of the SiC coat 3. The overcoat 5 forms surfaces other than the back face 31 of the SiC coat 3, that is, the first side face 32, the second side face 33, the front face 34, the first R-surface 36, the second R-surface 37, the third R-surface 38, and the fourth R-surface 39. More specifically, the backface portion 41 of the undercoat 4 forms the back face 31 of the outer surface 30. The first upper layer side-face portion 52 of the overcoat 5 forms the first side face 32 and the first R-surface 36 of the outer surface 30. The second upper layer side-face portion 53 of the overcoat 5 forms the second side face 33 and the second R-surface 37 of the outer surface 30. The upper layer front-face portion 54 of the overcoat 5 forms the front face 34, the third R-surface 38, and the fourth R-surface 39 of the outer surface 30.

The SiC coat 3 has a two-layer structure including the undercoat 4 and the overcoat 5. However, the overcoat 5 does not entirely cover the undercoat 4, but partially covers it. Therefore, the first and second interfaces 61 and 62 formed by the overcoat 5 and the undercoat 4 appear on the outer surface 30 of the SiC coat 3. Specifically, the first upper layer side-face portion 52 of the overcoat 5 and the backface portion 41 of the undercoat 4 form the first interface 61. This first interface 61 appears on the first R-surface 36 of the outer surface 30. In addition, the second upper layer side-face portion 53 of the overcoat 5 and the backface portion 51 of the undercoat 4 form the second interface 62. The second interface 62 appears on the second R-surface 37 of the outer surface 30.

As illustrated in FIG. 3, the backface portion 41 of the undercoat 4 has a film thickness smaller than a film thickness of the first lower layer side-face portion 42 of the undercoat 4. As a result, the backface portion of the SiC coat 3 has a film thickness smaller than a film thickness of the side face portion. As a result, it is possible to increase conductivity of the backface portion of the SiC coat 3 relative to the side face portion.

As illustrated in FIG. 2, the first R-surface 36 extends in a first direction 63 perpendicular to a normal direction of the back face 31 and a normal direction of the first side face 32. According to this embodiment, the first direction 63 corresponds to a circumferential direction of the outer ring 1. In addition, the first interface 61 appearing on the first R-surface 36 extends along the first direction 63. According to this embodiment, the first interface 61 appears in an annular shape slightly larger than the inner diameter of the outer ring 1.

The second R-surface 37 extends along a second direction 64 perpendicular to the normal direction of the back face 31 and the normal direction of the second side face 33. According to this embodiment, the second direction 64 corresponds to the circumferential direction of the outer ring 1. In addition, the second interface 62 appearing on the second R-surface 37 extends along the second direction 64. According to this embodiment, the second interface 62 appears in an annular shape slightly smaller than the outer diameter of the outer ring 1.

Figure 4:
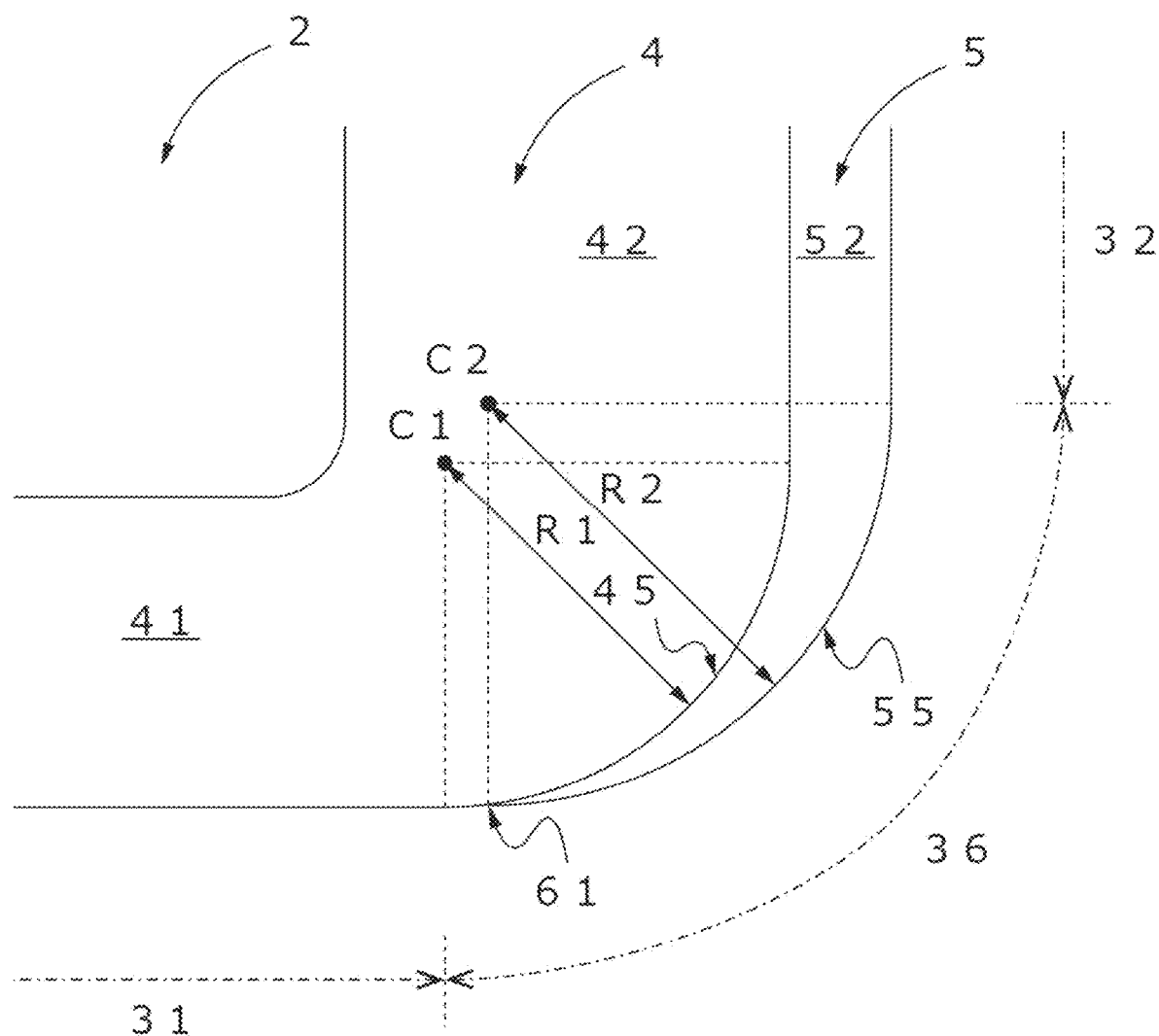
FIG. 4 is an enlarged view illustrating a part B of the A-A cross-sectional view of the outer ring.
Figure 5:
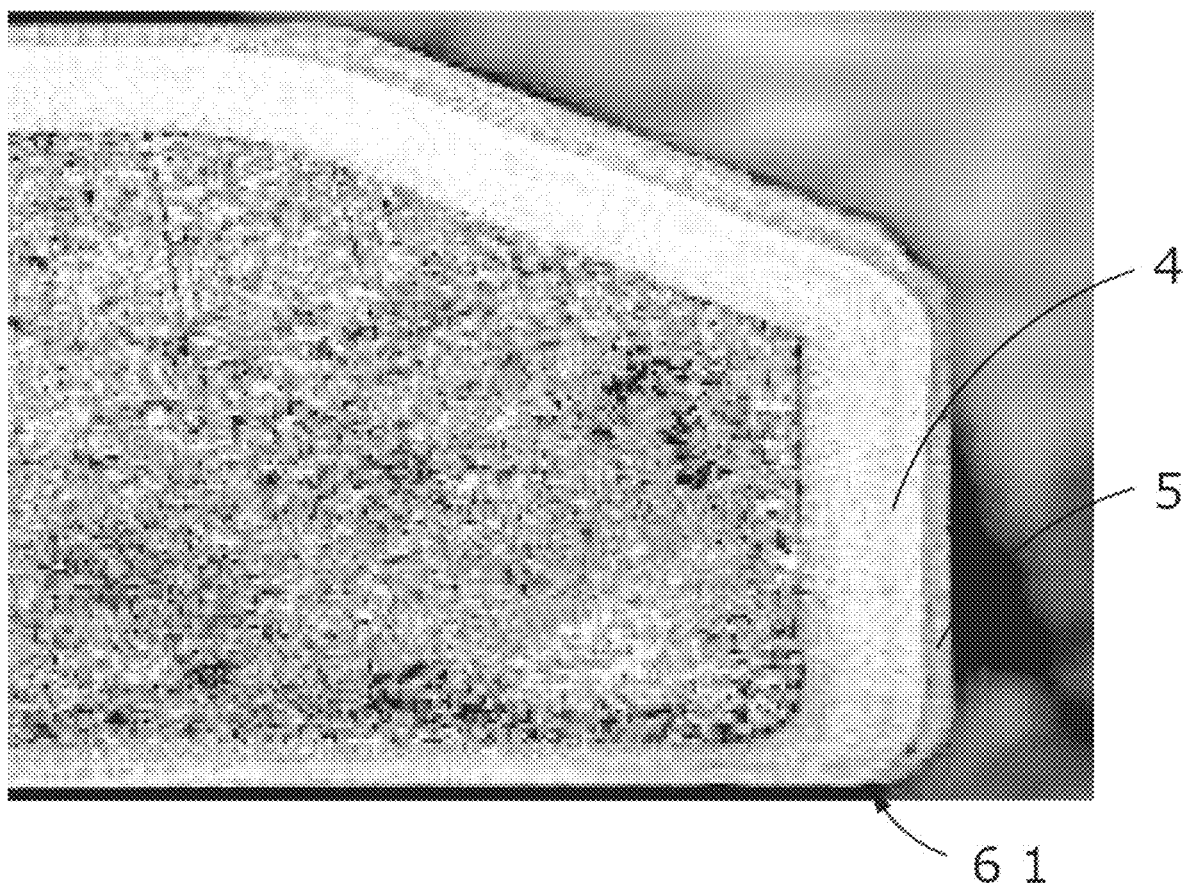
FIG. 5 is a diagram illustrating a cross-sectional photograph of the outer ring.

FIG. 4 schematically illustrates a cross section of the outer ring 1. This cross section is perpendicular to the back face 31 and the first side face 32 of the outer surface 30. FIG. 5 illustrates an actual photograph of the cross section of the outer ring 1. The first lower layer side-face portion 42 of the undercoat 4 has a surface having a shape of an arc 45 on this cross section. The arc 45 has a center C1 and a radius of curvature R1. The first upper layer side-face portion 52 of the overcoat 5 has a surface having a shape of an arc 55 on this cross section. The arc 55 has a center C2 and a radius of curvature R2. The first upper layer side-face portion 52 has a film thickness profile gradually reduced toward the first interface 61. As a result, the shape of the arc 55 is formed.

As illustrated in FIG. 4, the center C2 of the arc 55 is placed in a position different from the center C1 of the arc 45. As a result, the first interface 61 appears on the first R-surface 36. In addition, the radius of curvature R2 of the arc 55 is equal to or larger than the radius of curvature R1 of the arc 45. As a result, the first R-surface 36 is formed as a smooth domical shape. The radiuses of curvature R1 and R2 are set to, for example, 1 mm or larger and 10 mm or smaller.

Note that the first interface 61 may also appear on an end of the first R-surface 36. For example, the first interface 61 may appear on a boundary between the first R-surface 36 and the back face 31 or a boundary between the first R-surface 36 and the first side face 32.

Since the second R-surface 37 has the same structure as that of the first R-surface 36, the description will not be repeated. However, the second R-surface 37 is not necessary to have the same dimension as that of the first R-surface 36.

(2) Modifications

Needless to say, various forms may be possible within the technical scope of th invention without limiting the embodiments of the invention to the aforementioned examples.

Figure 6:
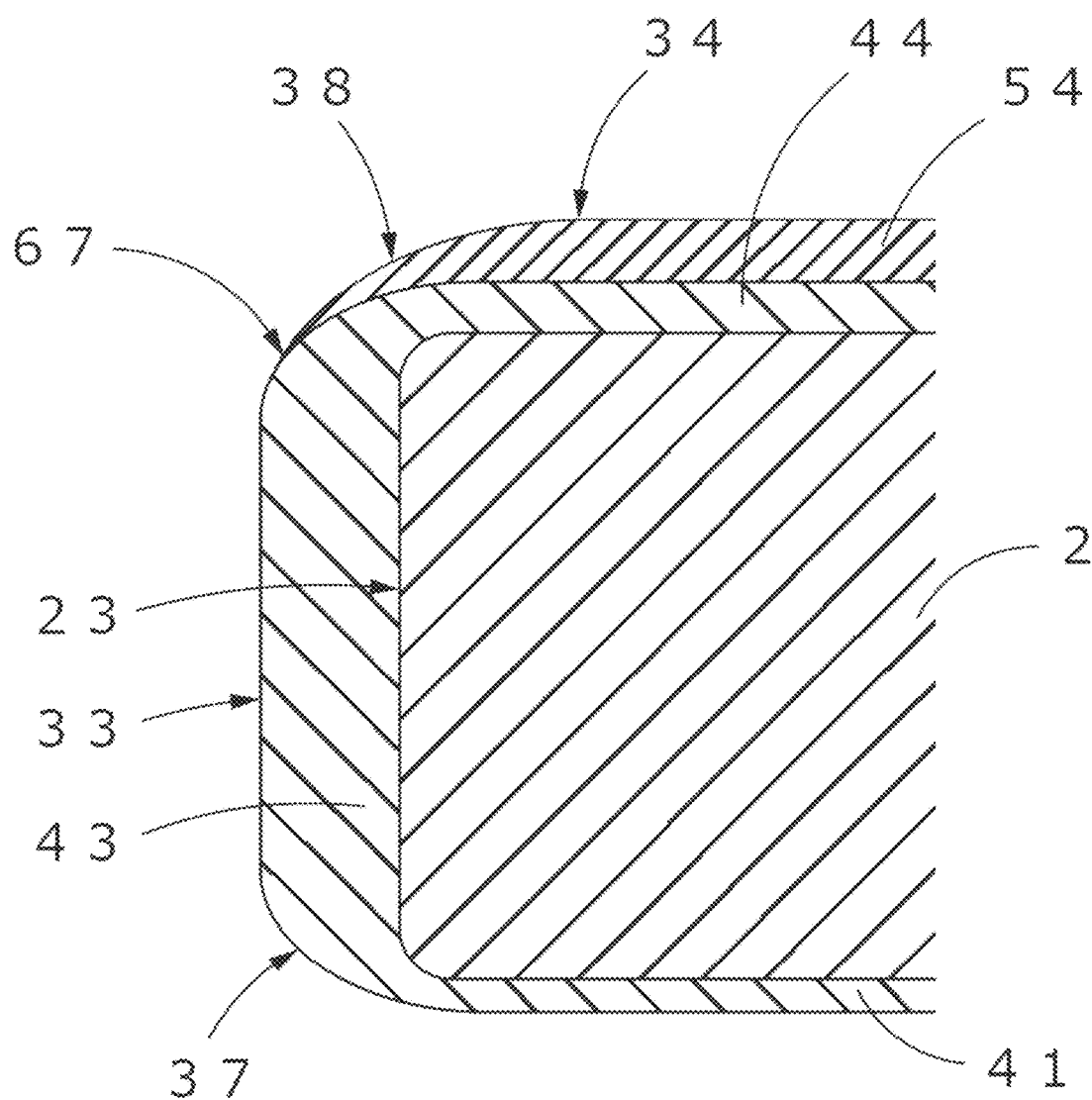
FIG. 6 is a cross-sectional view illustrating an outer ring according another embodiment of the invention.

For example, in the aforementioned embodiment, the interface appears on the first and second R-surfaces 36 and 37. However, the interface may also appear on the first and third R-surfaces 36 and 38. In this configuration, as illustrated in FIG. 6, the upper layer front-face portion 54 of the overcoat 5 and the second lower layer side-face portion 43 of the undercoat 4 form a third interface 67. The third interface 67 appears on the third R-surface 38 of the outer surface 30. Note that, as illustrated in FIG. 1, the third R-surface 38 extends in the second direction 64. The third interface 67 appearing on the third R-surface 38 extends along the second direction 64.

In the aforementioned embodiment, the SiC coat 3 covers an annular member having an opening in the center, such as the annular substrate 2. However, a shape of the coating target of the SiC coat 3 is not limited to the annular shape, but may be a disc shape having no opening in the center. In addition, the shape of coating target may be polygonal without limiting to the circular shape.

In the aforementioned embodiment, the SiC coat 3 has a two-layer structure including the undercoat 4 and the overcoat 5. However, the SiC coat 3 may have a multilayered structure having three or more layers without limiting to the two-layer structure. For example, in the case of a three-layer structure including an undercoat, an intermediate coat, and an overcoat, both the interface between the undercoat and the intermediate coat and the interface between the intermediate coat and the overcoat may appear on the outer surface of the SiC coat. In this case, both the interfaces may appear on the same R-surface.

(3) Advantages and Effects

In this configuration, since the first interface 61 appears on the first R-surface 36, it becomes inconspicuous. In addition, since the second interface 62 appears on the second R-surface 37, it becomes inconspicuous. Furthermore, since the third interface 67 appears on the third R-surface 38, it becomes inconspicuous.

In the aforementioned configuration, it is possible to make the film thickness of the backface portion of the SiC coat 3 smaller than the film thickness of the first side face portion. As a result, for example, it is possible to increase conductivity of the backface portion of the SiC coat 3 relative to the first side face portion.

REFERENCE SIGNS LIST 1 outer ring,
2 annular substrate,
3 SiC coat,
4 undercoat,
5 overcoat,
30 outer surface,
31 back face,
32 first side face,
33 second side face,
34 front face,
36 first R-surface,
37 second R-surface,
38 third R-surface,
39 fourth R-surface,
41 backface portion,
42 first lower layer side-face portion,
43 second lower layer side-face portion,
44 lower layer front-face portion,
52 first upper layer side-face portion,
53 second upper layer side-face portion,
54 upper layer front-face portion,
61 first interface,
62 second interface,
67 third interface.

The invention claimed is:

1. A SiC coat having an outer surface including a back face, a front face opposite to the back face, a first side face extending in a direction from the back face toward the front face, and a first R-surface between the back face and the first side face, the SiC coat comprising:
   an overcoat configured to include a first upper layer side-face portion that forms the first side face and the first R-surface of the outer surface; and
   an undercoat configured to include a backface portion that forms the back face of the outer surface and a first lower layer side-face portion covered by the first upper layer side-face portion of the overcoat,
   wherein the first upper layer side-face portion and the backface portion form a first interface, and
   the first interface appears on the first R-surface of the outer surface.

2. The SiC coat according to claim 1, wherein
   the first R-surface extends along a first direction perpendicular to a normal direction of the back face and a normal direction of the first side face, and
   the first interface appearing on the first R-surface extends along the first direction.

3. The SiC coat according to claim 1, wherein
   the outer surface further includes a second side face opposite to the first side face and a second R-surface between the back face and the second side face,
   the overcoat further includes a second upper layer side-face portion that forms the second side face and the second R-surface of the outer surface,
   the undercoat further includes a second lower layer side-face portion covered by the second upper layer side-face portion of the overcoat,
   the second upper layer side-face portion and the backface portion form a second interface, and
   the second interface appears on the second R-surface of the outer surface.

4. The SiC coat according to claim 3, wherein
   the second R-surface extends along a second direction perpendicular to a normal direction of the back face and a normal direction of the second side face, and
   the second interface appearing on the second R-surface extends along the second direction.

5. The SiC coat according to claim 1, wherein
   the outer surface further includes a second side face opposite to the first side face and a third R-surface between the front face and the second side face,
   the overcoat further includes an upper layer front-face portion that forms the front face and the third R-surface of the outer surface,
   the undercoat further includes a second lower layer side-face portion that forms the second side face and a lower layer front-face portion covered by the upper layer front-face portion of the overcoat,
   the upper layer front-face portion and the second lower layer side-face portion form a third interface, and
   the third interface appears on the third R-surface of the outer surface.

6. The SiC coat according to claim 5, wherein
   the third R-surface extends along a second direction perpendicular to a normal direction of the back face and a normal direction of the second side face, and
   the third interface appearing on the third R-surface extends along the second direction.

7. The SiC coat according to claim 1, wherein
   both the first upper layer side-face portion and the first lower layer side-face portion have a surface having an arc shape on a cross section perpendicular to the back face and the first side face, and
   a center of the arc of the first upper layer side-face portion is placed in a position different from a center of the arc of the first lower layer side-face portion.

8. The SiC coat according to claim 7, wherein
   the arc of the first upper layer side-face portion has a radius of curvature equal to or larger than a radius of curvature of the arc of the first lower layer side-face portion.

9. The SiC coat according to claim 1, wherein
   the backface portion of the undercoat has a film thickness smaller than a film thickness of the first lower layer side-face portion of the undercoat.

10. The SiC coat according to claim 1, wherein
    the SiC coat covers an annular substrate having a back face, a front face, an inner circumferential surface between the back face and the front face, and an outer circumferential surface between the back face and the front face,
    the backface portion of the undercoat covers the back face of the annular substrate, and
    the first lower layer side-face portion of the undercoat covers the inner circumferential surface of the annular substrate.

* * * * *